(12) United States Patent
Tsutsui et al.

(10) Patent No.: US 7,301,244 B2
(45) Date of Patent: Nov. 27, 2007

(54) SEMICONDUCTOR DEVICE

(75) Inventors: Yutaka Tsutsui, Kanagawa (JP); Norio Okada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 87 days.

(21) Appl. No.: 11/153,619

(22) Filed: Jun. 16, 2005

(65) Prior Publication Data
US 2005/0280149 A1 Dec. 22, 2005

(30) Foreign Application Priority Data
Jun. 18, 2004 (JP) ............................. 2004-180628

(51) Int. Cl.
*H01L 23/48* (2006.01)
(52) U.S. Cl. ............................. 257/779; 257/E21.508
(58) Field of Classification Search ................ 257/779, 257/780, 696, 762, 758, 752, E21.508, E21.509, 257/E21.519, 778
See application file for complete search history.

(56) References Cited

U.S. PATENT DOCUMENTS
6,949,832 B2 * 9/2005 Kunishima et al. ......... 257/762

FOREIGN PATENT DOCUMENTS
JP          2001-267323          9/2001

* cited by examiner

*Primary Examiner*—Howard Weiss
*Assistant Examiner*—(Vikki) Hoa B. Trinh
(74) *Attorney, Agent, or Firm*—Young & Thompson

(57) ABSTRACT

A semiconductor device should have a structure that allows locating electronic components in a region under a bonding pad. The semiconductor device includes a bonding pad constituting the external connection terminal; a region under the bonding pad including at least two copper layers and a connection via plug, under said bonding pad, disposed so as to connect copper layers that form a pair out of the at least two copper layers; a seal ring constituted of an annular conductor, disposed so as to surround the region under the bonding pad, and to connect a lower one of the copper layers that form said pair to copper layer to form a pair with the lower copper layer; and an interconnect connected to the bonding pad outside the seal ring.

20 Claims, 6 Drawing Sheets

SEMICONDUCTOR DEVICE

This application is based on Japanese patent application No. 2004-180628, the content of which is incorporated hereinto by reference.

BACKGROUND OF THE INVENTION

1. Field of the Invention

The present invention relates to a semiconductor device, and more particularly to a semiconductor device including an external connection terminal disposed on a semiconductor substrate.

2. Description of the Related Art

One of semiconductor devices that stand a stress or an impact applied to a bonding pad when performing a wire bonding process, despite a narrow spacing between the bonding pads, is disclosed in JP-A No. 2001-267323.

The cited document discloses a semiconductor device including a dummy interconnect located in an insulating interlayer, so that a bonding pad is directly sustained by the dummy interconnect.

SUMMARY OF THE INVENTION

The bonding pad is subjected to various inspections before shipment of the finished product, and besides when the bonding pad serves as a connection terminal, a chip is often brought in contact with the bonding pad for the purpose of the chip positioning, in a chip mounting process. An impact applied to the bonding pad at this moment may produce a crack in the bonding pad itself or on a lower face thereof. Such a crack is more prone to appear, especially when a low dielectric constant film such as SiOC is employed. Nevertheless, the cited document does not refer to any disadvantage originating from the appearance of the crack.

Actually electronic components have to be disposed in every available space including a region under a bonding pad, in order to satisfy the recent demand for miniturization of the semiconductor devices. However, although the semiconductor device according to the cited document is prone to produce a crack in relation with a bonding pad, this document does not provide any remedy for preventing the crack. Therefore, the semiconductor device according to the cited document cannot be considered as reliable enough to locate electronic components in a region that undergoes an impact in the bonding process.

In view of the foregoing, the present invention has been achieved based on a belief that the following steps are essential in upgrading the reliability of the semiconductor devices. Basically, some measure has to be taken, when disposing electronic components in a region under a bonding pad, against an impact applied thereto during inspections before the shipment, and at the positioning step for the wire bonding process. Also, intrusion of moisture through a crack produced by such an impact has to be addressed, as it may cause corrosion of an interconnect. In addition, the interconnect connected to the bonding pad have to be protected from the foregoing impacts.

According to the present invention, there is provided a semiconductor device having an external connection terminal located on a semiconductor substrate, comprising a bonding pad constituting the external connection terminal; a region under the bonding pad including at least two copper layers and a connection via plug, under the bonding pad, disposed so as to connect copper layers that form a pair out of the at least two copper layers; a seal ring constituted of an annular conductor, disposed so as to surround the region under the bonding pad, and to connect a lower one of the copper layers that form the pair to a copper layer to form a pair with the lower copper layer; and a lead interconnect connected to the bonding pad outside the seal ring.

The semiconductor device thus constructed absorbs an impact imposed by inspections before the shipment and by the positioning for the bonding process, in the specific structure including the plurality of copper layers and the connection via plugs in the region under the bonding pad, and the seal ring provided in the region under the bonding pad prevents the intrusion of moisture through a crack produced in the bonding pad, or a crack extending from the bonding pad as far as to the copper layer. Also, locating the lead interconnect outside the seal ring reduces the influence originating from the impact.

The foregoing semiconductor device may further comprise a passivation layer formed with an opening located in a region inside the seal ring.

Providing thus the passivation layer with its opening portion located in a region inside the seal ring improves the impact resistance of the region under the bonding pad.

In the foregoing semiconductor device, each of the copper layers that form a pair in the region under the bonding pad may be arranged along a flat plane. Alternately, each of the copper layers that form a pair in the region under the bonding pad may be arranged along a flat plane, and at least the upper copper layer, out of the copper layers that form the pair arranged along a flat plane in the region under the bonding pad, may be larger than the opening of the passivation layer.

Arranging thus the copper layers region under the bonding pad along a flat plane, and making the upper copper layer larger than the opening of the passivation layer, allows the copper layer disposed in direct contact with the bonding pad to absorb an impact applied to the bonding pad effectively.

In the foregoing semiconductor device, a lowermost copper layer among the copper layers may constitute the region under the bonding pad in combination with a closest upper copper layer, and the seal ring may be provided so as to surround the region under the bonding pad, such that the lowermost copper layer covers the region surrounded by the seal ring.

Including the case where three or more copper layers are provided in the region under the bonding pad, providing thus the seal ring between the lowermost copper layer and the closest upper copper layer, and forming the lowermost copper layer so as to cover the region surrounded by the seal ring, improves the impact resistance because of the presence of the multiple copper layers, and effectively provides moisture resistance even though a crack is produced so as to reach the lower layers.

In the foregoing semiconductor device, the lead interconnect may be connected directly to a terminal of a plane region directly contacting the region under the bonding pad, outside the seal ring.

The bonding pad containing aluminum may incur degradation in electromigration (EM) resistance, depending on a connection layout between the bonding pad and the lead interconnect. However, locating the lead interconnect outside the seal ring and extending the plane region in contact with the region under the bonding pad up to the lead interconnect for connection effectively prevents degradation in EM resistance.

In the foregoing semiconductor device, a copper layer directly contacting the bonding pad, among the copper layers in the region under the bonding pad, may be split into a section connected to the connection via plugs and a section connected to the seal ring.

In the region under the bonding pad, splitting the copper layer that is in contact with the bonding pad, into a section connected to the connection via plugs and a section connected to the seal ring, eliminates the possibility that an influence of a crack is propagated as far as to the section connected to the seal ring, even when the crack is produced in a region connected to the connection via plugs, which is considered to be the regions where a greatest portion of an impact force is applied, that is, the bonding pad or the copper layer connected to the bonding pad. Accordingly, such a structure effectively reduces the influence of the crack that may affect an interconnect located outside the seal ring.

The semiconductor according to the present invention allows absorbing an impact applied to a bonding pad during inspections before the shipment or in a positioning step for the wire bonding process, and securing a space for locating electronic components in a region under the bonding pad, still preventing corrosion of an interconnect due to possible intrusion of moisture through a crack produced in the bonding pad or an associated region, and further reducing the influence of the impact that may affect an interconnect extending to an external chip.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the accompanying drawings, embodiments of a semiconductor device according to the present invention will be described hereunder. Throughout the drawings, same constituents are given an identical numeral, and duplicating description may be omitted.

FIRST EMBODIMENT

Figure 1:
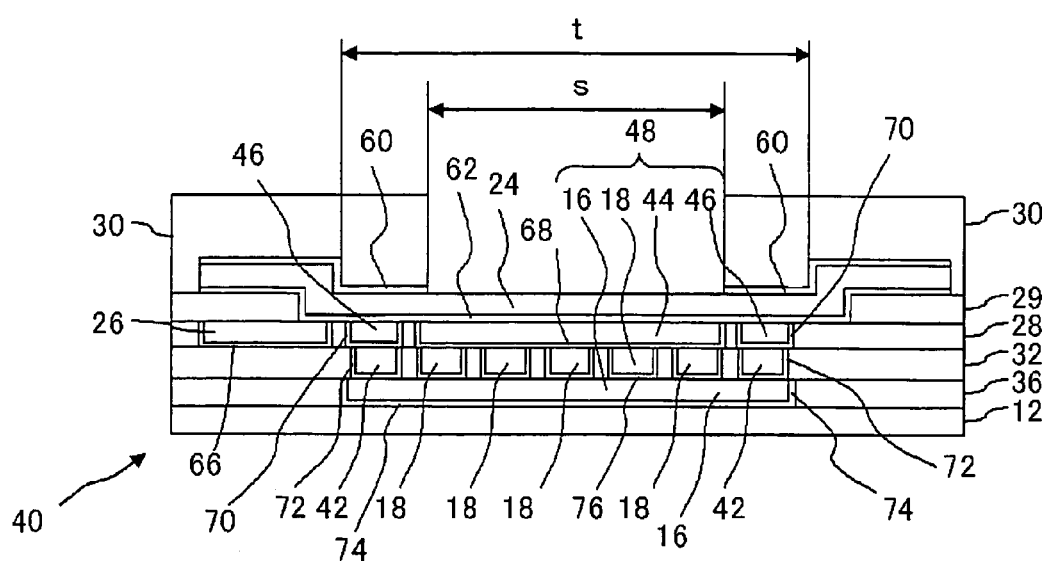
FIG. 1 is a schematic cross-sectional view showing a part a semiconductor device according to a first embodiment of the present invention.
Figure 2A:
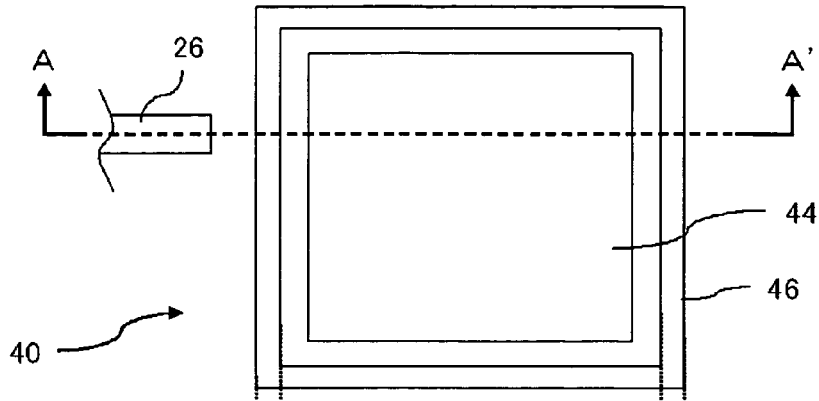
FIGS. 2A to 2C are plan views showing insulating interlayers constituting the region under the bonding pad according to the first embodiment.
Figure 2B:
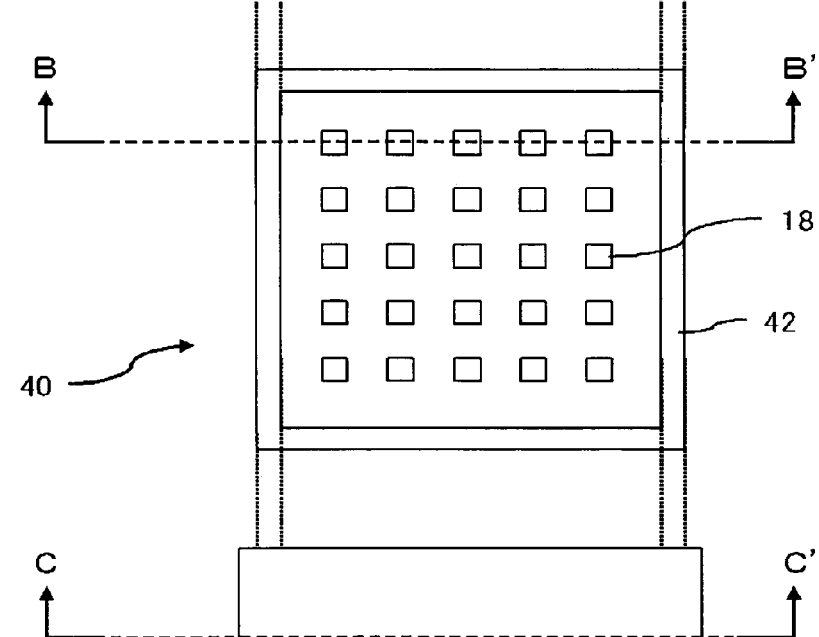
Figure 2C:
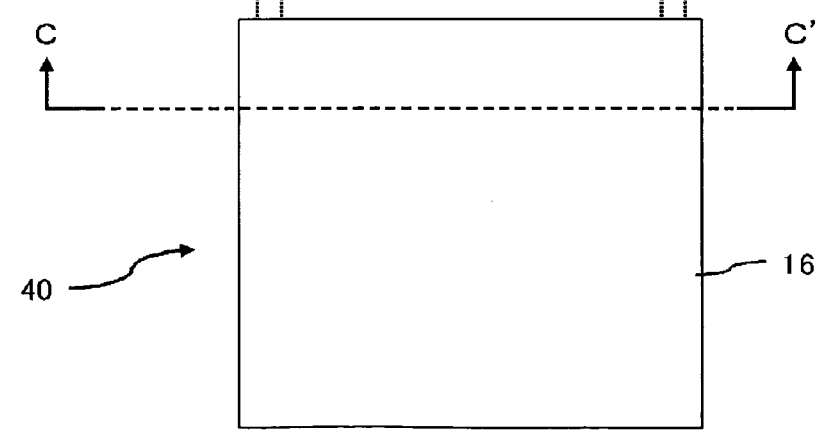

FIG. 1 is a schematic cross-sectional view showing a part a semiconductor device according to a first embodiment of the present invention, and FIGS. 2A to 2C are plan views showing interlayer dielectrics 28, 32 and 34, respectively, according to the first embodiment.

The semiconductor device according to this embodiment includes a bonding pad 24 serving as an external connection terminal, a region (under the bonding pad) 48 including, under the bonding pad 24, a first copper layer 44 and a second copper layer 16 located under the bonding pad 24, corresponding to at least two copper layers, as well as connection via plugs 18 provided so as to connect the first copper layer 44 and the second copper layer 16, a seal ring 42 constituted of an annular conductor disposed so as to surround the region under the bonding pad 48, and connecting the second copper layer 16, which is the lower copper layer in the pair, to the first copper layer 44, which forms a pair with the second copper layer 16, and an interconnect 26 connected to the bonding pad 24 outside the seal ring 42.

From another viewpoint, the semiconductor device 40 includes a passivation layer 30, the bonding pad 24 located in an insulating layer 29, the first copper layer 44, a seal ring copper layer 46 and the interconnect 26 located in an insulating interlayer 28, the connection via plugs 18 and the seal ring 42 located in an insulating interlayer 32, the second copper layer 16 located in an insulating interlayer 36, and an insulating layer 12, in this order from the top.

The bonding pad 24 includes aluminum or an alloy predominantly composed of aluminum and a barrier metal layer, formed in a total thickness of 600 to 2500 nm, which may include 20 to 100 nm of a first barrier metal layer, 500 to 2000 nm of AlCu layer and 80 to 400 nm of a second barrier metal layer from the top, for example.

The bonding pad 24 serves as an external connection terminal. More specifically, when packaging the LSI the bonding pad 24 serves as a base for bonding a wire for electrical connection between various circuit elements and an element outside the LSI. The bonding pad 24 may also be employed as a connection terminal when performing a flip-chip bonding for mutual connection with another semiconductor chip thus to form a stacked structure, or for face-down bonding of a semiconductor chip on an interconnect substrate.

The bonding pad 24 is also connected, via the barrier metal layer 62, to the first copper layer 44 to be described in details later, the seal ring copper layer 46 that constitutes the seal ring to be described later, and to the interconnect 26 serving as a lead interconnect for connection to an external device. Accordingly, the interconnect 26 is electrically connected to the external element such as a chip, connected to the bonding pad 24.

The bonding pad 24 is covered with an insulating layer (not shown) such as an $SiO_2$ layer of 100 to 200 nm in thickness via the barrier metal layer 60, and further covered with the passivation layer 30 for example constituted of a polyimide, having a thickness of 300 to 8000 nm.

Regarding the size of the opening of the passivation layer 30, the plane region of the bonding pad 24 and a region defined by the seal ring 42, the region defined by the seal ring 42 may be made smaller than the plane region t of the bonding pad 24, but larger than the opening s of the passivation layer 30, as shown in FIG. 1. As a specific example, the plane region t of the bonding pad may be formed in dimensions of 40 to 60 μm by 90 to 130 μm, the opening s of the passivation layer in 35 to 55 μm by 85 to 125 µm, and the dimensions of the region defined by the seal ring 42 may be appropriately determined between the plane region t and the opening s.

Such arrangement of locating the opening, through which an impact is applied to the bonding pad 24, at an inner position inside the region defined by the seal ring 42 prevents the seal ring 42 from being subjected to the impact, and allows effectively absorbing the impact in the region (under the bonding pad) 48 including two copper layers 44, 46 and the connection via plugs 18. Accordingly, the impact resistance of the bonding pad 24 can be improved.

In the semiconductor device according to this embodiment, the region under the bonding pad may include three or more copper layers, to thus improve the impact resistance. In this case, a lowermost copper layer among the copper layers may constitute the region under the bonding pad in combination with a closest upper copper layer, and the seal ring may be provided so as to surround the region under the bonding pad, such that the lowermost copper layer covers the region surrounded by the seal ring.

Such a structure allows improving the impact resistance because of the presence of the multiple copper layers, when three or more copper layers are provided in the region under the bonding pad, and effectively provides moisture resistance even though a crack is produced so as to reach the lower layers.

Here, providing a plurality of connection via plugs 18 as shown in FIG. 1 enhances the impact absorbing effect. However, it is a matter of course that providing just one connection via plug 18 equally provides the intended effect of the present invention.

Also, aluminum contained in the bonding pad may incur degradation in EM resistance, depending on a connection layout between the bonding pad and the lead interconnect. However, directly connecting the lead interconnect 26, without an intermediation of a contact hole, to the plane region of the bonding pad 24 at a position outside the seal ring 42 in the region under the bonding pad 24, in other words locating the lead interconnect outside the seal ring and expanding the plane region facing the region 48 under the bonding pad 24 up to the lead interconnect for connection, effectively prevents degradation in EM resistance.

The first copper layer 44, the seal ring copper layer 46 and the interconnect 26 are constituted of copper or an alloy predominantly composed of copper, in a thickness of 300 to 2000 nm. Between the first copper layer 44 and the insulating interlayers 28 and 32, a barrier metal layer 68 constituted of a TaN film and a Ta film is provided. Likewise, a barrier metal layer 70 is provided between the seal ring copper layer 46 and the insulating interlayers 28 and 32, and a barrier metal layer 66 is provided between the interconnect 26 and the insulating interlayers 28 and 32.

Referring now to FIG. 2A, in the insulating interlayer 28 the first copper layer 44 is disposed in a plane so as to cover a predetermined two-dimensionally extending region, and the seal ring copper layer 46 is located so as to surround the first copper layer 44. The interconnect 26 is disposed outside the seal ring copper layer 46, that is, in a region outside the seal ring 42. Here, the cross-section of the insulating interlayer 28 shown in FIG. 1 corresponds to the line A-A' of FIG. 2A.

Referring back to FIG. 1, under the first copper layer 44, a second copper layer 16 is provided in an insulating interlayer 36, so that the insulating interlayer 32 is interposed therebetween. The second copper layer 16 is constituted of copper or an alloy predominantly composed of copper and has a thickness of 300 to 2000 nm, like the first copper layer 44. In a region between the second copper layer 16 and the insulating interlayer 36, and in a region between the second copper layer 16 and the insulating layer 12, a barrier metal layer 74 constituted of a TaN film and a Ta film is provided.

In a region between the first copper layer 44 and the second copper layer 16 in the insulating interlayer 32, a plurality of connection via plugs 18, constituted of copper or an alloy predominantly composed of copper in a depth of 300 to 2000 nm, is provided for connecting the first and the second copper layers. Likewise, the seal ring 42 constituted of an annular conductor made of copper or an alloy predominantly composed of copper in a depth of 300 to 2000 nm is provided, in a region between the seal ring copper layer 46 and the second copper layer 16 in the insulating interlayer 32, for connecting the seal ring copper layer 46 and the second copper layer 16.

In a region between each of the connection via plugs 18 and the insulating interlayer 32, and in a region between each of the connection via plugs 18 and the second copper layer 16, a barrier metal layer 76 constituted of a TaN film and a Ta film is provided. Likewise, a barrier metal layer 72 is provided in a region between the seal ring 42 and the insulating interlayer 32, and in a region between the seal ring 42 and the second copper layer 16.

Referring to FIG. 2B, a plurality of connection via plugs 18 is two-dimensionally arranged in a region corresponding to a region under the first copper layer 44 in the insulating interlayer 32, and the seal ring 42 is located around such region. Here, the cross-section of the insulating interlayer 32 shown in FIG. 1 corresponds to the line B-B' of FIG. 2B. In addition, FIG. 2C shows the second copper layer 16 provided in the insulating interlayer 36 under the insulating interlayer 32. The second copper layer 16 is disposed so as to cover the region defined by the seal ring 42.

The connection via plugs 18 may be formed in a slit shape for example, instead of in a dot shape as shown in FIG. 2.

As described above, providing the region under the bonding pad 48 including the first copper layer 44, the seal ring copper layer 46, the connection via plugs 18 and the second copper layer 16 so as to directly contact the lower face of the bonding pad 24 allows absorbing an impact imposed by inspections before the shipment and by the positioning for the bonding process, in the structure of the region under the bonding pad.

Also, two-dimensionally disposing the first copper layer 44 in the region under the bonding pad 48, over an area larger than the opening of the passivation layer 30, facilitates the first copper layer 44, which is directly connected to the bonding pad 24, to absorb an impact force applied to the bonding pad 24 effectively.

Also, providing the seal ring copper layer 46 around a periphery of the region under the bonding pad 48 prevents intrusion of moisture into the interconnect 26 through a crack, which might be produced in the bonding pad.

Further, disposing the interconnect 26 outside the seal ring 42 keeps the interconnect from being subjected to an impact by inspections before the shipment and by the positioning for the bonding process, thereby reducing the influence of the crack.

Further, in region under the bonding pad 48, splitting the copper layer contacting the bonding pad 24 into the first copper layer 44 and the seal ring copper layer 46 as shown in FIG. 1 eliminates the possibility that an influence of a crack is propagated up to the seal ring copper layer 46 connected to the seal ring, even when the crack is produced in a region connected to the connection via plug, that is, the first copper layer 44, which is the region where a greatest portion of an impact force is considered to be applied. Accordingly, such a structure effectively reduces the influence of the crack that might otherwise affect an interconnect 26, since the interconnect 26 is located outside the seal ring. In addition, forming the opening of the passivation layer 30 in a region within the seal ring 42 allows directing an impact only toward the first copper layer 44, thereby further reducing the influence of the crack over the interconnect.

The foregoing structure allows disposing electronic components, though not shown in FIG. 1, in a region right under the bonding pad.

The following passage covers a method of manufacturing the semiconductor device according to the first embodiment.

FIGS. 3A to 3C, and 4A to 4C are schematic cross sectional views for explaining a manufacturing process of the semiconductor device according to the first embodiment.

Figure 3A:
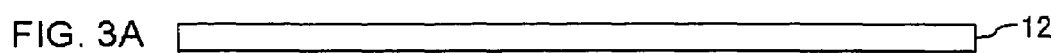
FIGS. 3A to 3C are schematic cross sectional views for explaining a manufacturing process of the semiconductor device according to the first embodiment.
Figure 3B:
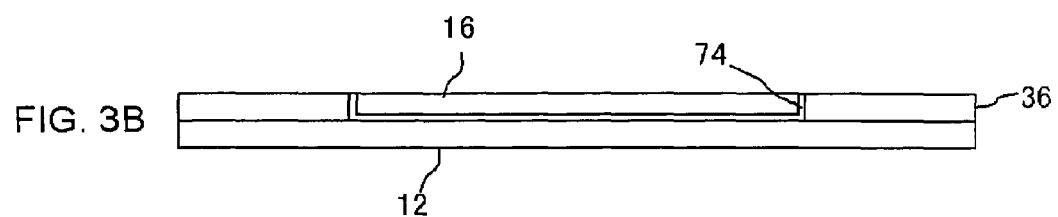

All over the insulating layer 12 (FIG. 3A), firstly the insulating interlayer 36 constituted of a low dielectric constant film, such as a silicon nitride layer having a thickness of 10 to 50 nm or an SiOC layer having a thickness of 300 to 2000 nm, is formed by a CVD (chemical vapor deposition) process, and a plasma etching is performed in combination with a photolithography process to form a groove, in which the second copper layer is to be provided. Then a sputtering process is performed to form a barrier metal layer, which is a stacked layer including a tantalum nitride layer and a tantalum layer having a thickness of 10 to 50 nm, all over the insulating interlayer 36, after which a copper seed layer is formed in a thickness of 50 to 300 nm and a plating process is performed to form a copper layer so as to completely fill the groove. This is followed by a CMP (chemical mechanical polishing) process to remove an unnecessary portion of the barrier metal layer and the copper layer, thus to form the barrier metal layer 74 and the second copper layer 16 (FIG. 3B).

Figure 3C:
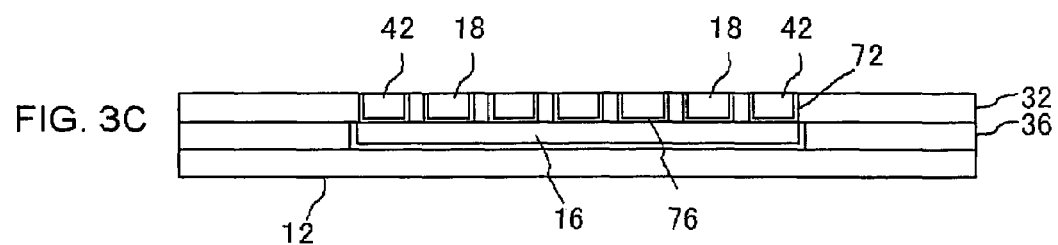

Thereafter, the insulating interlayer 32 constituted of a low dielectric constant film, such as a silicon nitride layer having a thickness of 10 to 50 nm or an SiOC layer having a thickness of 300 to 2000 nm, is formed all over the insulating interlayer 32 by a CVD process, and a plasma etching is performed in combination with a photolithography process to form via holes and an annular groove. Then a sputtering process is performed to form a barrier metal layer, which is a stacked layer including a tantalum nitride layer and a tantalum layer having a thickness of 10 to 50 nm, all over the insulating interlayer 32, after which a copper seed layer is formed in a thickness of 50 to 300 nm and a plating process is performed to form a copper layer so as to completely fill the via holes and the annular groove. This is followed by a CMP process to remove an unnecessary portion of the barrier metal layer and the copper layer, thus to form the connection via plugs 18 and an annular conductor, respectively including the barrier metal layer 76 and the copper layer remaining in the via hole and the annular groove. At this stage, the barrier metal layer 72 and the copper layer in the annular groove located around the connection via plugs 18 constitutes the seal ring 42 (FIG. 3C).

Figure 4A:
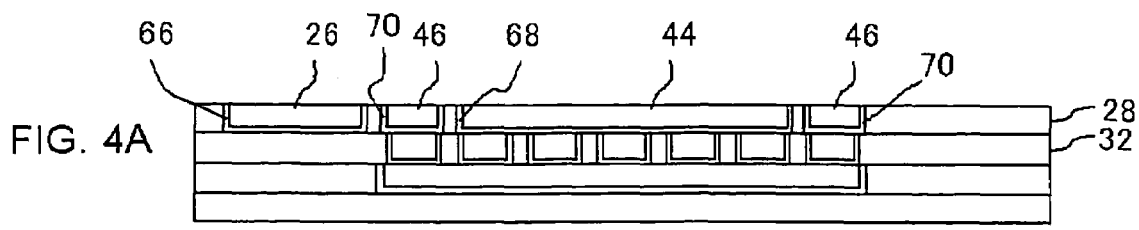
FIGS. 4A to 4C are schematic cross sectional views for explaining a manufacturing process of the semiconductor device according to the first embodiment.

Thereafter, the insulating interlayer 28 constituted of a low dielectric constant film such as a silicon nitride layer having a thickness of 10 to 50 nm, or an SiOC layer having a thickness of 300 to 2000 nm, is formed all over the insulating interlayer 32 by a CVD process, and a plasma etching is performed in combination with a photolithography process to form grooves respectively intended for the first copper layer 44, the seal ring copper layer 46 and the interconnect 26. Then a sputtering process is performed to form a barrier metal layer, which is a stacked layer including a tantalum nitride layer and a tantalum layer having a thickness of 10 to 50 nm, all over the insulating interlayer 28, after which a copper seed layer is formed in a thickness of 50 to 300 nm and a plating process is performed to form a copper layer so as to completely fill the respective grooves. This is followed by a CMP process to remove an unnecessary portion of the barrier metal layer and the copper layer, thus to form the respective sets of the barrier metal layer 68 and the first copper layer 44, the barrier metal layer 70 and the seal ring copper layer 46, and the barrier metal layer 66 and the interconnect 26 (FIG. 4A).

Figure 4B:
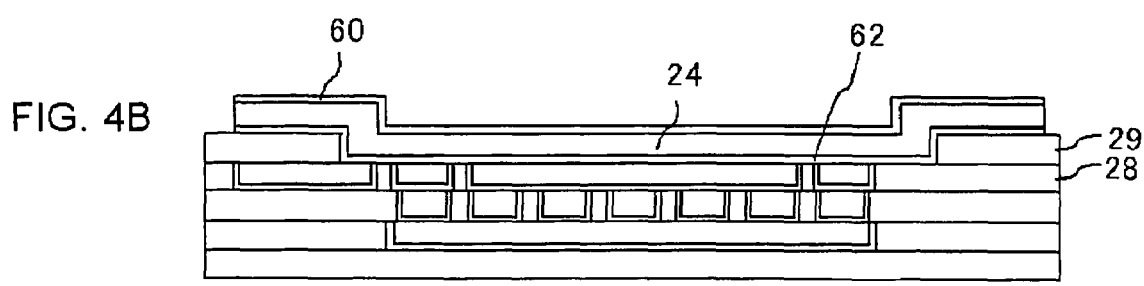
Figure 4C:
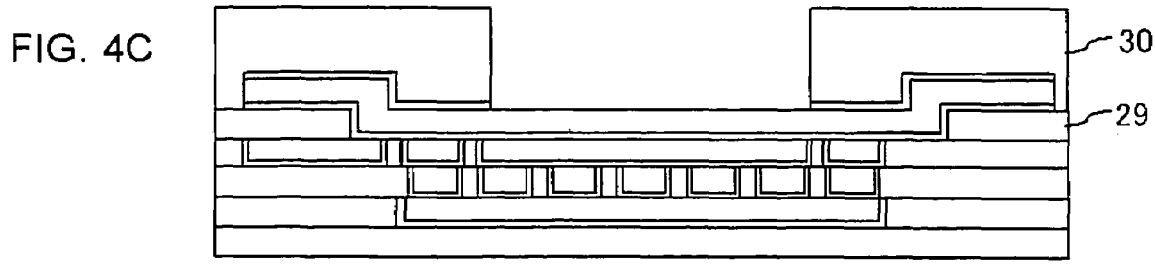

Then a CVD process is again performed to form the insulating layer 29 constituted of a silicon oxide ($SiO_2$) layer of 600 to 2500 nm in thickness all over the insulating interlayer 28, and a photolithography process is performed to locate a resist pattern on the silicon oxide layer, to thereby define a position for a stacked layer predominantly containing Al, which is to constitute the bonding pad 24. After removing an exposed portion of the silicon oxide layer by etching to form an opening and removing the resist pattern, a sputtering process is performed to form a stacked layer including a first barrier metal layer (20 to 100 nm in thickness), an AlCu layer (500 to 2000 nm) and a second barrier metal layer (80 to 400 nm) from the top (FIG. 4B).

Thereafter, a resist pattern is provided by photolithography on the first barrier metal layer, constituting the outermost surface of the stacked layer, to define the position of the bonding pad 24, and an exposed portion of the stacked layer is removed by etching thus to form the bonding pad 24, followed by removal of the resist pattern.

Then a silicon oxide ($SiO_2$) layer of 100 to 200 nm in thickness is formed so as to cover the first barrier metal layer, that is the outermost surface of the bonding pad 24, and a polyimide layer or the like of 300 to 8000 nm in thickness is laid over the silicon oxide layer, thus to form a passivation layer. Finally an opening is provided by photolithography on the passivation layer at a position corresponding to the bonding pad 24, so as to expose the surface of the stacked layer, that is the first barrier metal layer, which is then removed by etching so as to expose the AlCu layer of the bonding pad 24, and to thereby constitute the passivation layer 30 formed with the opening having the size as described above (FIG. 4C).

The foregoing method employs a single Damascene process for forming the connection via plugs, though a dual Damascene process may also be employed, as specifically described below.

After executing the steps represented by FIG. 3B, low dielectric constant films including a silicon nitride layer of 10 to 50 nm in thickness and an SiOC layer or the like of 300 to 2000 nm in thickness in this order are formed all over the insulating interlayer 36 by a CVD process thus to form the insulating interlayer 32, and a CVD process is again performed to sequentially stack low dielectric constant films including a silicon nitride layer of 10 to 50 nm in thickness and an SiOC layer of 300 to 2000 nm in thickness or the like all over the insulating interlayer 32, thus to form the insulating interlayer 28.

Then a plasma etching is performed in combination with a photolithography process to form grooves respectively intended for the first copper layer 44, the seal ring copper layer 46 and the interconnect 26, on the insulating interlayer 28 located at the top, and also to form via holes and an annular groove, respectively intended for the connection via plugs and the seal ring, in the insulating interlayer 32 located under the insulating interlayer 28.

Then a sputtering process is performed to sequentially stack a tantalum layer and a tantalum nitride layer having a thickness of 10 to 50 nm, thus to form a barrier metal layer, after which a copper seed layer is formed in a thickness of 50 to 300 nm and a plating process is performed to form a copper layer so as to completely fill the grooves and via holes formed in the insulating interlayer 28 (upper) and the insulating interlayer 32 (lower). This is followed by a CMP process to remove an unnecessary portion of the barrier metal layer and the copper layer, thus to form the respective sets of the barrier metal layer 68 and the first copper layer 44, and the barrier metal layer 70 and the seal ring copper layer 46, and the barrier metal layer 66 and the interconnect 26 in the insulating interlayer 28 (upper). In the insulating interlayer 32 (lower), the barrier metal layer 76 and the copper layer constitute the connection via plugs 18, and the barrier metal layer 72 and the copper layer in the annular groove constitute the seal ring 42 (FIG. 4A). Hereafter, similar steps to the foregoing passage are taken, to constitute the semiconductor device according to the first embodiment.

In this embodiment a low dielectric constant film such as an SiOC layer is employed to form the insulating interlayer, while a silicon oxide layer may also be employed.

SECOND EMBODIMENT

Figure 5:
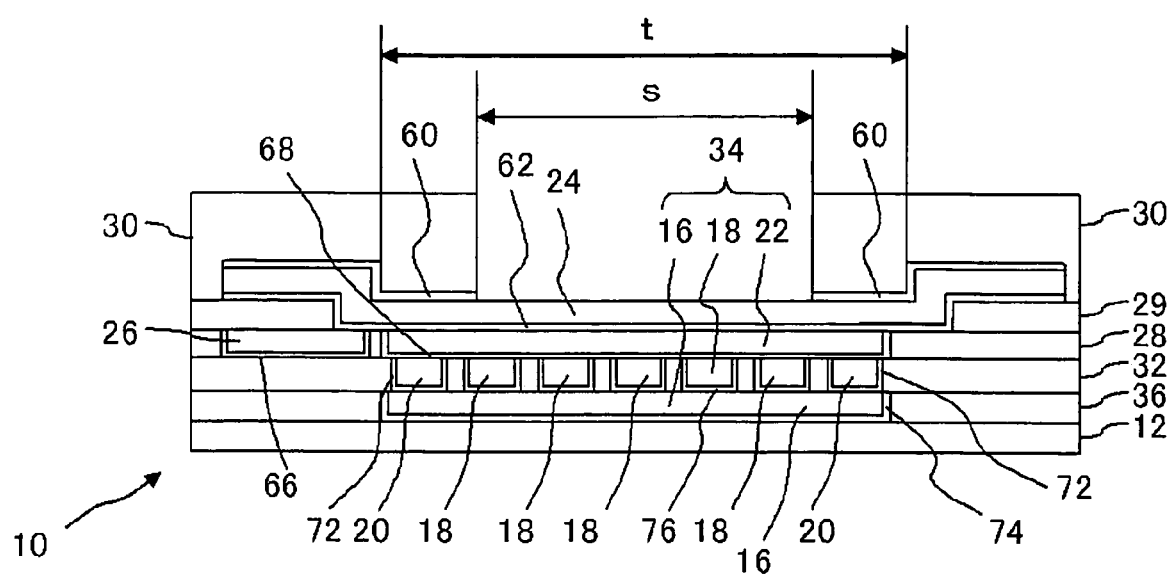
FIG. 5 is a schematic cross-sectional view showing a part a semiconductor device according to a second embodiment of the present invention.

FIG. 5 is a schematic cross-sectional view showing a part a semiconductor device according to a second embodiment of the present invention.

A semiconductor device 10 according to the second embodiment has basically the same structure as the semiconductor device 40 according to the first embodiment shown in FIG. 1. A difference is that the first copper layer 44 and the seal ring copper layer 46, separately formed in the insulating interlayer 28 in the first embodiment, are continuously formed to constitute a unified first copper layer 22.

Also, the semiconductor device 10 can be fabricated through substantially the same steps as those taken in the first embodiment.

Providing thus a region under the bonding pad 34, including the first copper layer 22, a plurality of connection via plugs 18 and the second copper layer 16 so as to directly contact the lower face of the bonding pad 24 allows absorbing an impact imposed by inspections before the shipment and by the positioning for the bonding process, in the structure of the region under the bonding pad.

Also, providing a seal ring 20 around a periphery of the region under the bonding pad 34 prevents intrusion of moisture into the interconnect 26 through a crack, which might be produced in the bonding pad.

Further, disposing the interconnect 26 outside the seal ring 20 keeps the interconnect from being subjected to an impact by inspections before the shipment and by the positioning for the bonding process, thereby reducing the influence of the crack.

The foregoing structure allows disposing electronic components, though not shown in FIG. 5, in a region right under the bonding pad.

THIRD EMBODIMENT

Figure 6:
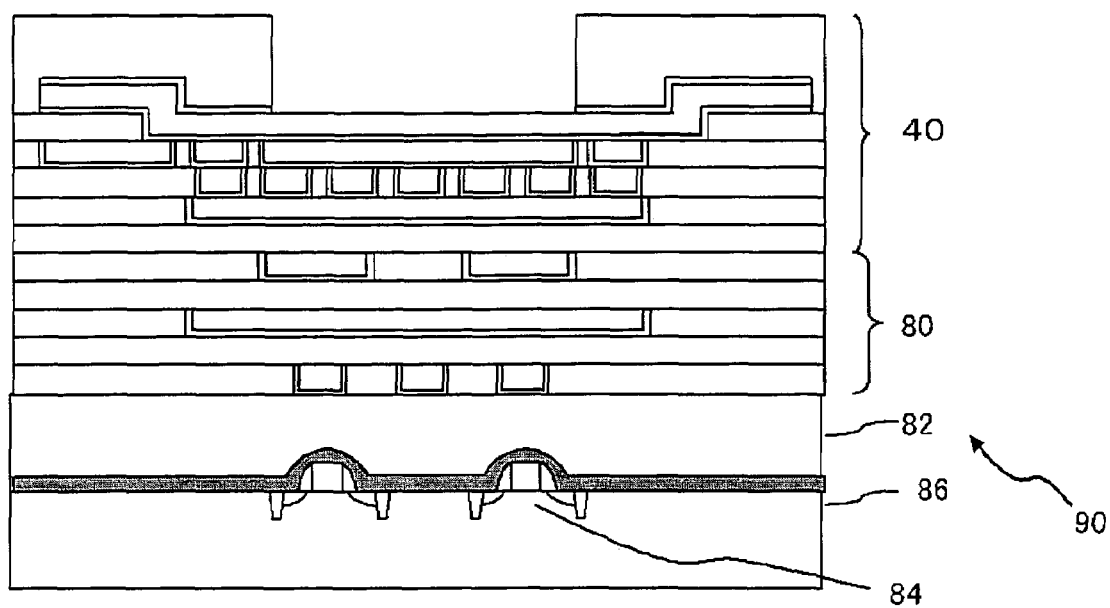
FIG. 6 is a schematic cross-sectional view showing an application example of the semiconductor device according to the present invention.

FIG. 6 is a schematic cross-sectional view showing a part of a semiconductor device according to a third embodiment of the present invention.

A semiconductor device 90 according to the third embodiment includes a multilayer interconnect 80 disposed under the semiconductor device 40 according to the first embodiment, and a silicon substrate 86, which serves as the base substrate of this semiconductor device, disposed in contact with a lower face of a lowermost insulating interlayer 82. In the silicon substrate 86, an MOS (metal oxide semiconductor) 84 which is an electronic device, may be located at a position corresponding to the opening of the semiconductor device 40 serving as an external connection terminal.

As described above, the semiconductor device 40 according to this embodiment is sufficiently reliable for locating electronic components right under the bonding pad. Employing the semiconductor device 40 as a section to constitute a bonding pad for connection to an external device allows locating an electronic device right under the bonding pad without compromise in the quality and performance of the device, which leads to further miniaturization of the chip dimensions. Accordingly, such structure provides a higher degree of freedom in designing the layout of the semiconductor chip itself.

It is apparent that the present invention is not limited to the above embodiment, that may be modified and changed without departing from the scope and spirit of the invention.

What is claimed is:

1. A semiconductor device having an external connection terminal located on a semiconductor substrate, comprising:
  a bonding pad constituting said external connection terminal;
  a region under said bonding pad including at least two copper layers and a connection via plug, under said bonding pad, said connection via plug disposed so as to connect said copper layers that form a pair of at least two connected copper layers;
  a seal ring constituted of an annular conductor disposed so as to surround said region under said bonding pad, said annular conductor connecting a lower one of said copper layers that form said pair to an upper one of said copper layers; and
  a lead interconnect connected to said bonding pad outside said seal ring.

2. The semiconductor device according to claim 1, further comprising a passivation layer formed with an opening located in a region inside said seal ring.

3. The semiconductor device according to claim 1, wherein each of said copper layers that form a pair in said region under said bonding pad is arranged along a flat plane.

4. The semiconductor device according to claim 2, wherein each of said copper layers that form a pair in said region under said bonding pad may be arranged along a flat plane; and
  at least said upper copper layer, out of said copper layers that form said pair arranged along a flat plane in said region under said bonding pad, is larger than said opening of said passivation layer.

5. The semiconductor device according to claim 1, wherein a lowermost copper layer among said copper layers constitutes said region under said bonding pad in combination with a closest upper copper layer, and said seal ring is disposed so as to surround said region under said bonding pad, such that said lowermost copper layer covers said region surrounded by said seal ring.

6. The semiconductor device according to claim 1, wherein said lead interconnect is connected directly to a terminal of a plane region directly contacting said region under said bonding pad, outside said seal ring.

7. The semiconductor device according to claim 1, wherein a copper layer directly contacting said bonding pad, among said copper layers in said region under said bonding pad is split into a section connected to said connection via plugs and a section connected to said seal ring.

8. The semiconductor device according to claim 1, wherein said copper layer and said connection via plugs in said region under said bonding pad are formed by either a single Damascene process or a dual Damascene process.

9. A semiconductor device comprising:
said semiconductor device according to claim 1;
a semiconductor substrate; and
an electronic element provided between said region under said bonding pad and said semiconductor substrate.

10. The semiconductor device according to claim 1, wherein said seal ring has an interior perimeter and an exterior perimeter.

11. A semiconductor device having an external connection terminal located on a semiconductor substrate, comprising:
a bonding pad constituting said external connection terminal, said bonding pad having an exterior perimeter;
a region located in vertical registration below the exterior perimeter of said bonding pad, said region including i) at least two copper layers located at different layers and having exterior perimeters in vertical registration within the exterior perimeter of the bonding pad, ii) at least one connection via plug connecting the at least two copper layers to each other, and iii) a seal ring comprised of an annular conductor surrounding said at least one via plug and connecting said at least two copper layers to each other; and
a lead interconnect connected to said bonding pad at a connection point located in vertical registration below said bonding pad and outside said seal ring.

12. The semiconductor device according to claim 11, further comprising a passivation layer formed with an opening located in a region inside said seal ring.

13. The semiconductor device according to claim 12, wherein said at least two copper layers form a pair of connected layers, and at least said upper copper layer is larger than said opening of said passivation layer.

14. The semiconductor device according to claim 11, wherein the exterior perimeter of a lowermost copper layer of said at least two copper layers is in vertical registration below and outside the exterior perimeter of said seal ring.

15. The semiconductor device according to claim 11, wherein said seal ring has an interior perimeter and an exterior perimeter.

16. A semiconductor device having an external connection terminal located on a semiconductor substrate, comprising:
a bonding pad constituting said external connection terminal, said bonding pad having an exterior perimeter;
region located in vertical registration below the exterior perimeter of said bonding pad, said region including i) two copper layers located at different layers and having exterior perimeters in vertical registration below the exterior perimeter of the bonding pad, ii) at least one connection via plug connecting said two copper layers to each other, and iii) a seal ring comprising an annular conductor surrounding said at least one connection via plug and an upper copper layer, said seal ring connecting a lower copper layer and said bonding pad; and
a lead interconnect connected to said bonding pad at a connection point located in vertical registration below said bonding pad and outside said seal ring.

17. The semiconductor device according to claim 16, further comprising a passivation layer formed with an opening located in a region inside said seal ring.

18. The semiconductor device according to claim 16, further comprising a passivation layer located on top of the bonding pad and comprising an opening located in a region inside the interior perimeter of said seal ring.

19. The semiconductor device according to claim 16, wherein said seal ring has an interior perimeter and an exterior perimeter.

20. A semiconductor device comprising:
said semiconductor device according to claim 16;
a semiconductor substrate; and
an electronic element provided between said region located in vertical registration below the exterior perimeter of said bonding pad and said semiconductor substrate.

* * * * *